United States Patent
Park et al.

(10) Patent No.: US 7,429,868 B2
(45) Date of Patent: Sep. 30, 2008

(54) SOCKET ASSEMBLY FOR TESTING SEMICONDUCTOR DEVICE

(75) Inventors: Chan Ho Park, Cheonan-si (KR); Chul Ho Ham, Yongin-si (KR); Young Geun Park, Yongin-si (KR); Ho Keun Song, Seongnam-si (KR); Woo Young Lim, Seoul (KR); Jae Bong Seo, Seongnam-si (KR)

(73) Assignee: Mirae Corporation, Chonan-si (KR)

( * ) Notice: Subject to any disclaimer, the term of this patent is extended or adjusted under 35 U.S.C. 154(b) by 0 days.

(21) Appl. No.: 11/196,238

(22) Filed: Aug. 4, 2005

(65) Prior Publication Data

US 2006/0170412 A1 Aug. 3, 2006

(30) Foreign Application Priority Data

Jan. 28, 2005 (KR) ............... 10-2005-0007975

(51) Int. Cl.
*G01R 31/26* (2006.01)
(52) U.S. Cl. ............................................. 324/765
(58) Field of Classification Search ................. None
See application file for complete search history.

(56) References Cited

U.S. PATENT DOCUMENTS

| | | | | |
|---|---|---|---|---|
| 5,227,717 A | * | 7/1993 | Tsurishima et al. | 324/754 |
| 5,469,074 A | * | 11/1995 | Drabenstadt et al. | 324/758 |
| 5,731,709 A | * | 3/1998 | Pastore et al. | 324/760 |
| 6,160,410 A | * | 12/2000 | Orso et al. | 324/757 |
| 6,222,377 B1 | * | 4/2001 | Kato | 324/754 |
| 6,326,799 B1 | * | 12/2001 | Schein | 324/754 |
| 6,333,638 B1 | * | 12/2001 | Fukasawa et al. | 324/765 |
| 6,441,488 B1 | * | 8/2002 | Smith | 324/755 |
| 6,472,891 B1 | * | 10/2002 | Tran | 324/755 |
| 6,888,362 B2 | * | 5/2005 | Eldridge et al. | 324/757 |
| 7,114,976 B2 | * | 10/2006 | Cram | 439/330 |
| 2001/0011898 A1 | * | 8/2001 | Haseyama et al. | 324/754 |
| 2001/0054905 A1 | * | 12/2001 | Khandros et al. | 324/754 |

* cited by examiner

*Primary Examiner*—Jermele M Hollington
(74) *Attorney, Agent, or Firm*—Ked & Associates, LLP

(57) ABSTRACT

A socket assembly for testing semiconductor devices includes a socket board electrically connected to an outside testing device, and a socket guide which covers the socket board. The socket guide has an open part to receive the semiconductor device and allows pins on the semiconductor device to couple with connection pins on the socket board. A spacer may be interposed between the socket board and the socket guide to maintain a predetermined distance between the semiconductor device and the socket board. In this manner, the balls or the leads of each semiconductor device may be pressed onto connection pins of the socket to a predetermined depth, even when the semiconductor devices have different thicknesses.

19 Claims, 9 Drawing Sheets

SOCKET ASSEMBLY FOR TESTING SEMICONDUCTOR DEVICE

This application claims the benefit of the Patent Korean Application No. P2005-07975, filed on Jan. 28, 2005, which is hereby incorporated by reference as if fully set forth herein.

BACKGROUND OF THE INVENTION

1. Field of the Invention

The present invention relates to a testing semiconductor device, and more particularly, to a socket assembly for testing semiconductor device.

2. Discussion of the Related Art

Generally, memory or non-memory semiconductors are released after various testing steps when manufactured. A handler is a device used to transfer and test semiconductors in the testing process. Commonly, in a handler, when trays, therein semiconductors being stored, are stacked in a loading stacker, a picker robot transfers semiconductors which will be tested to a test site and connects them to a test socket, thereby performing a predetermined test, and again the picker robot transfers the devices which tested completely to an unloading stacker and repeatedly performs a process for classifying them in the predetermined tray based on testing results.

FIG. 1 is a sectional view illustrating that a semiconductor of a conventional handler is connected to a socket assembly.

Shown in FIG. 1, a conventional socket assembly for testing semiconductors comprises a socket board 10 wherein a plurality of connecting pins 11 electrically connected to a tester of an outer testing device is formed, a socket guide 20 secured to cover the socket board 10 on an upper side of the socket board 10. An open part 21 is formed in the center of the socket guide 20 in order that a semiconductor (S) may move toward the socket board 10.

The semiconductor (S) is connected to connection pins 11 of the socket board 10, being mounted on a carrier 50 disposed in a test tray (not shown) at a predetermined distance. 51 (no description) is a latch securing/detaching the semiconductor (S) on/from the carrier 50.

Accordingly, a separate transportation device transfers a test tray (not shown), and then lines up each carrier 50 in an outer side of the socket assembly. In succession, when a press unit 60 outside presses each carrier 50 at predetermined power, a lower surface of each carrier 50 touches an upper surface of a socket guide 20 and simultaneously the semiconductor (S) mounted on each carrier 50 is connected to a socket board 10, thereby performing a testing.

However, the structure connecting a conventional semiconductor (S) to a socket board 10 of a socket assembly has the following problems.

First, in case that a thickness of each semiconductor for being tested is varied, each carrier 50 each semiconductor (S) mounted thereon should be replaced, thereby causing a problem of increasing a cost.

In other words, balls (B) of each semiconductor are pressed in a predetermined depth by a press unit 60. However, although the semiconductors are the same kind, each semiconductor body and each mold part, may be thicker or thinner in a process of manufacturing. When the thicknesses of the semiconductors are various, the strength applied when the balls of each semiconductor are pressed to the connection pins is various, thereby causing a problem that the balls of each semiconductor may be damaged and/or the testing may not be performed well due to a poor connection.

Therefore, conventionally the strength applied when the balls of each semiconductor are pressed to the connection pins is controlled by adjusting the thickness of the portion where the semiconductor (S) of each carrier 50 is seated. In that case, it is almost impossible to adjust the thickness by manufacturing all the carriers respectively, so that the carriers of each tray are replaced with carriers having each thickness corresponding to each semiconductor.

Generally, in case of a handler for testing memory semiconductors, more than 10 test trays are used in one handler and 63 carriers are installed in each tester. Thus when all carriers should be replaced, the cost may increase and may take a longer time to replace the carriers, thereby causing a problem that the testing efficiency may deteriorate.

Second, there are many cases that a semiconductor may have a bending in order that a center of the semiconductor may be convex, compared with edges of the semiconductor, thereby causing a problem that balls in a center of each semiconductor are not connected well to connection pins of an assembly socket.

Conventionally, the balls in the center of each semiconductor are firmly connected to the connection pins of the socket by a press unit for pressing the semiconductor heavily.

However, when the press unit presses the semiconductor heavily, the connection in the center of the semiconductor is completely performed, but a problem may be arise that the balls or the connection pins may be damaged because it presses the edges too much.

SUMMARY OF THE INVENTION

Accordingly, the present invention is directed to a socket assembly for testing semiconductor device that substantially obviates one or more problems due to limitations and disadvantages of the related art.

An object of the present invention is to provide a socket assembly for testing semiconductor device, wherein leads or balls of a semiconductor is/are pressed into connection pins of a socket in a predetermined depth without replacing carriers and etc, thereby preventing the semiconductor and the socket from being damaged and enhancing reliability of testing.

Another object of the present invention is to provide a socket assembly for testing semiconductor device capable of firmly connecting a semiconductor to a socket without pressing with too much force in spite of a bending of a semiconductor Additional advantages, objects, and features of the invention will be set forth in part in the description which follows and in part will become. apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a handler for testing semiconductor device including carriers for detachably securing semiconductors, a socket assembly wherein each semiconductor is electrically connected and testing is performed, and a press unit for connecting each semiconductor to the socket assembly by pressing the carriers toward the socket assembly. And a socket assembly of a handler comprises a socket board electrically connected to a testing device outside, wherein a plurality of connection pins connected to leads of a semiconductor is provided; a socket guide mounted to cover the socket board, with an open part formed on a first side thereof so that the semiconductor may be in/out, thereby connected to connection pins of the socket; and a spacer interposed between the socket board and the socket guide for maintaining a predetermined distance between the semiconductor and the socket board, touching an surface of the semiconductor having moved into an inside of the socket guide.

According to the present invention, when a semiconductor mounted on each carrier is inserted into an inside of a socket guide and connected to connection pins, the surface of the semiconductor touches the spacer before a carrier touches a socket guide. Therefore, the semiconductor and the socket board may maintain a predetermined distance regardless of the semiconductor thickness, thereby the semiconductor capable of being connected to the connection pins of the socket board in a predetermined depth.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In description of preferred embodiments, a semiconductor for being tested is a BGA type semiconductor, wherein a plurality of balls is formed on a first surface thereof. However, a socket assembly of the present invention may be similarly applied to various kinds of semiconductors besides a BGA type semiconductor.

To help understanding, same reference codes are used in the constitutional elements of a socket assembly of the present invention same as ones of a conventional socket assembly.

Referenced to FIGS. 2 through 5, a first embodiment of a socket assembly for testing semiconductor device according to the present invention will be described in the followings.

Figure 1:
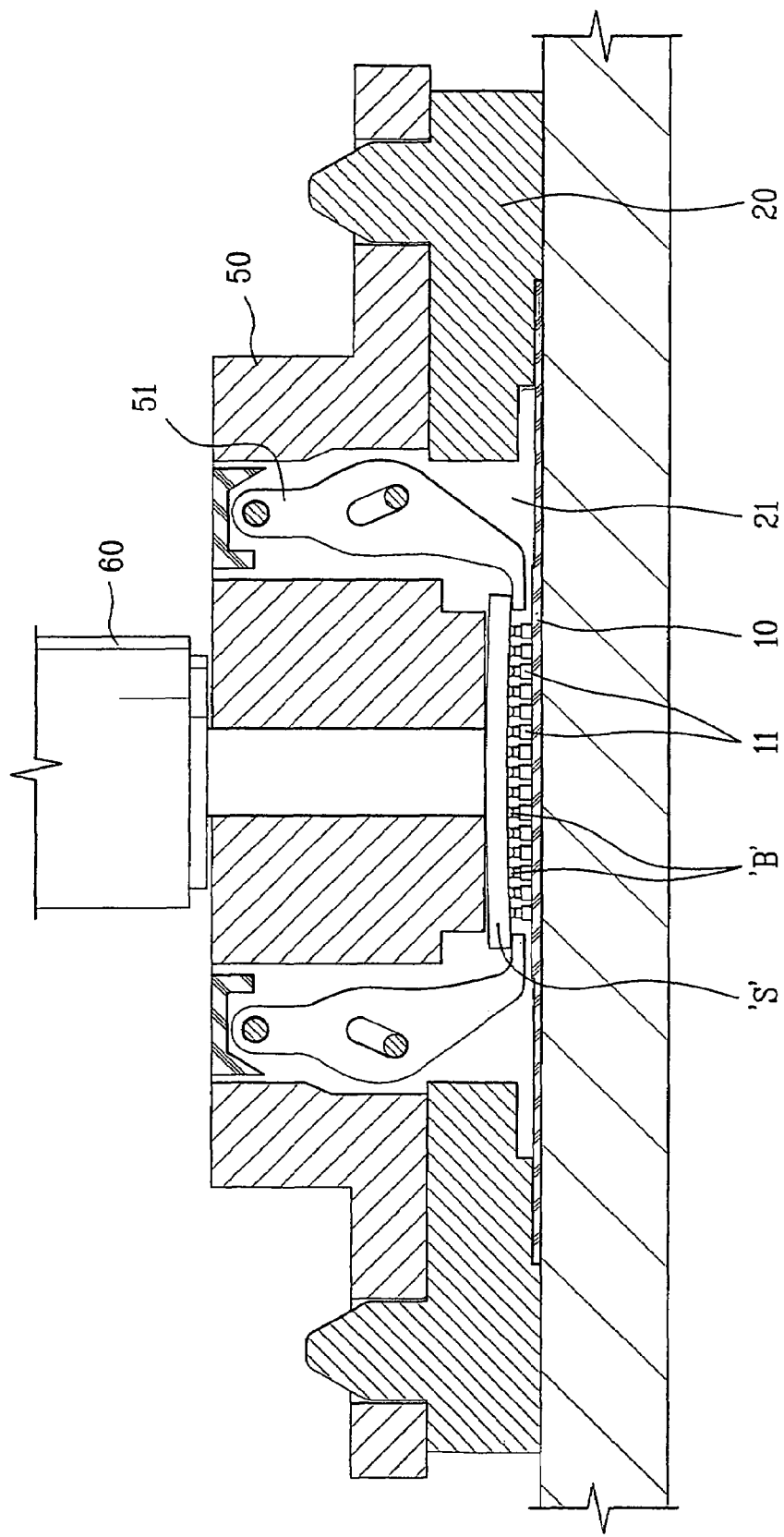
FIG. 1 illustrates a sectional view of a conventional socket assembly for testing semiconductor device.
Figure 2:
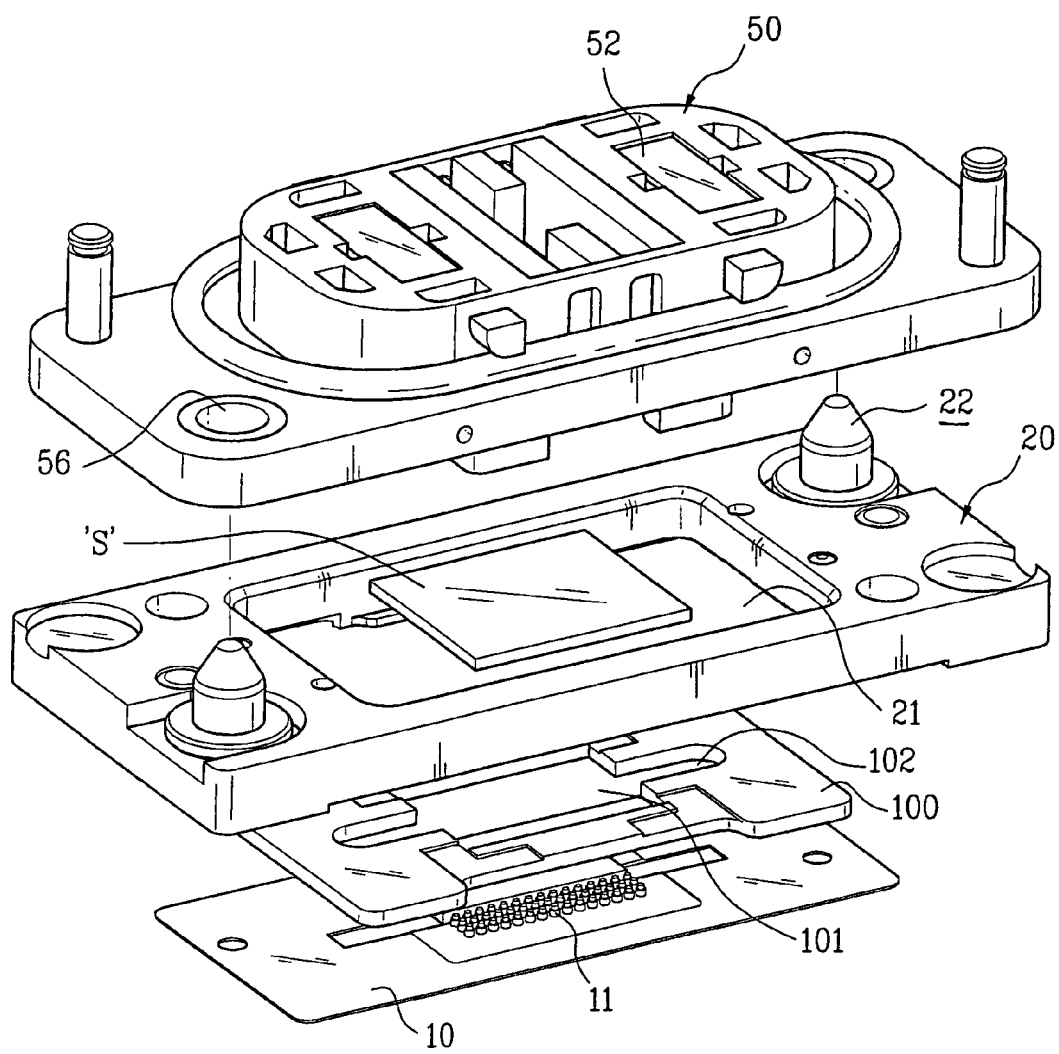
FIG. 2 illustrates an exploded perspective view of a socket assembly for testing semiconductor device according to a first preferred embodiment of the present invention.
Figure 3:
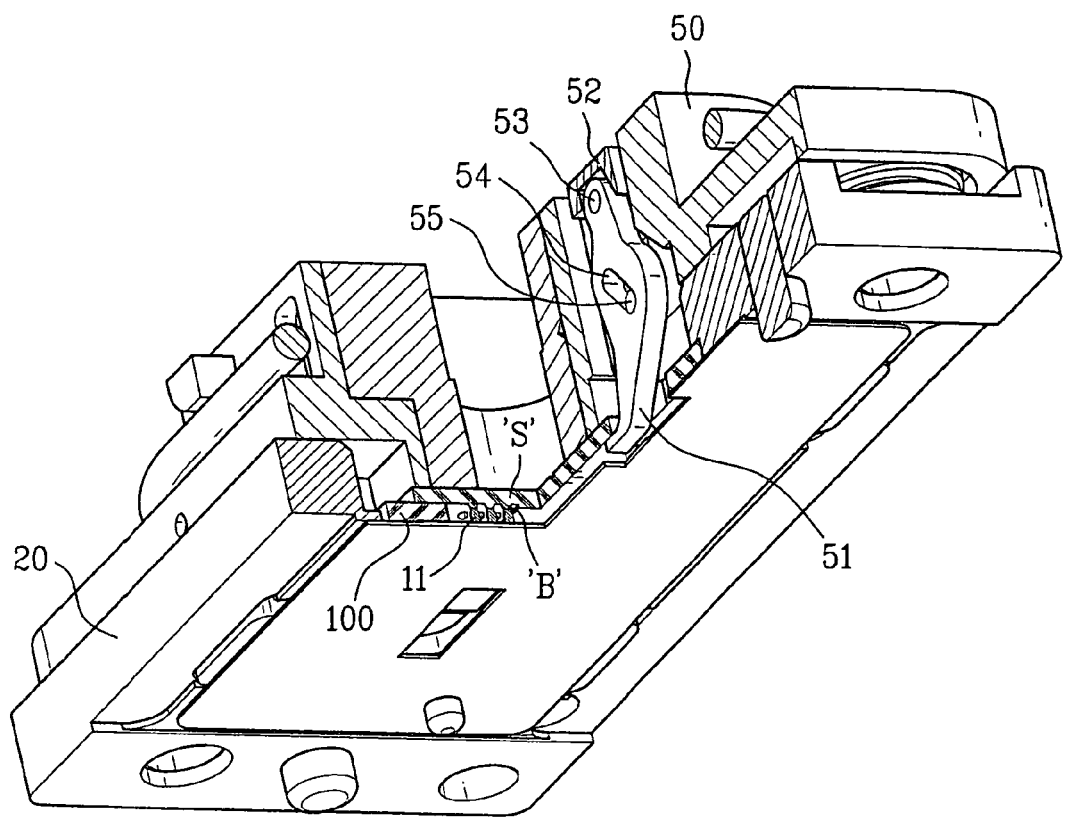
FIG. 3 illustrates a cut-away perspective view of a socket assembly of FIG. 2.

Shown in FIGS. 2 and 3, a socket assembly of the present invention comprises a socket board 10 wherein a plurality of connection pins 11 is formed, a socket guide 20 formed to cover an upper side of the socket board 10, and a spacer 100 contactably supporting a semiconductor (S) having moved into an inner side space of the socket guide 20 between the socket guide 20 and the socket board 10.

Carriers 50 are formed in a test tray (not shown) at a predetermined distance in plural, for example 64 carriers, and each carrier 50 is employed to keep a semiconductor (S) temporarily in a test tray.

A seating part 50a therein a semiconductor (S) seated is formed on a center of a lower surface of each carrier 50, and a pair of latches 51 for securing/detaching the semiconductor (S) and an operation button 52 moving up/down for operating the latches 51 are formed in both sides of each carrier 50. The operation button 52 is elastically supported by a compressed spring (not shown).

Each latch 51 of each carrier 50 is rotatably fastened about a hinge shaft 53. Also, a guide groove 54 is formed in an inclined long circle shape in the center of the latch 51. A guide pin 55 is secured to the carrier 50 in the guide groove 54

Thus, when the operation button 52 is pressed from outside, the operation button 52 moves down against an elasticity of the compressed spring (not shown). Then the latch 51 is rotoated outward and there is space between the latch 51 and the semiconductor (S), thereby detaching the semiconductor (S).

On the contrary, when the outside force having pressed the operation button 52 is removed, the operation button 52 returns to its original location by the elasticity of the compressed spring (not sown). Then, the latch 51 is rotated inward by guiding of the guide pin 55, thereby securing the semiconductor (S).

An open part 21 is formed in a center of a socket guide 20 of the socket assembly so as that a semiconductor (S) may approach to a socket board 10. Also, guide parts 22 in a cone shape inserted into guide holes 56 are formed projected upward at the two corners of an upper surface of the socket guide 20. When the carrier 50 approaches to the socket guide 20, each guide part 22 is inserted into each guide hole 56 of the carrier 50 and employed to guide the carrier 50 to its accurate location in the socket guide 20.

The connection pins 11 of the socket board 10 are electrically connected to a tester of an outside testing device and the number and the pitch of the connection pins 11 are corresponding to those of the balls (B) of the semiconductor (S).

The spacer 100 is formed in a center portion in a plate shape, therein an open part 101 is formed so as that the connection pins 11 of the socket board 10 may be passed through together. In both sides of the open part 101 latch escape holes 102 are formed, being passed through so as that the latches 50 of the carrier 50 may be inserted therein.

The spacer 100 may be made of various kinds of materials such as metal, however it is preferable but not necessary that the spacer 100 is made of a resin material such as plastic.

The spacer 100 touches a surface of a semiconductor (S) just before or at the moment that a lower surface of the carrier 50 touches an upper surface of a socket guide 20 when connecting a semiconductor (S) to connection pins 11. Thus, the spacer 100 is employed as a kind of a hard stopper so that the semiconductor (S) may maintain a predetermined distance with the socket board 10, in other words, so that the balls (B)

of the semiconductor (S) may be pressed to the connection pins 11 in a predetermined depth.

Therefore, the spacer 100 is formed thick enough that the balls (B) of the semiconductor (S) may be pressed to the connection pins 11 in a predetermined depth at the same time that the spacer 100 may touch a surface of the semiconductor (S).

The size of the socket guide 20, the spacer 100 and the carrier 50 may be set up by the size that the spacer 100 is capable of touching the surface of the semiconductor (S) just before or at the moment that the carrier 50 touches the surface of the socket guide 20, on a basis of the thinnest of all semiconductors (S) for being tested.

If the size of the socket guide 20, the spacer 100 and the carrier 50 is set up on a basis of the semiconductor which is thick or thicker, testing the thicker semiconductors is performed well. However when testing the thinnest semiconductor, the carrier 50 touches the socket guide 20 before the semiconductor (S) touches the spacer 100, thereby the balls (B) of the semiconductor (S) may not be connected deep enough or not be connected at all.

The detailed description of an operation of the socket assembly is the following.

Figure 4:
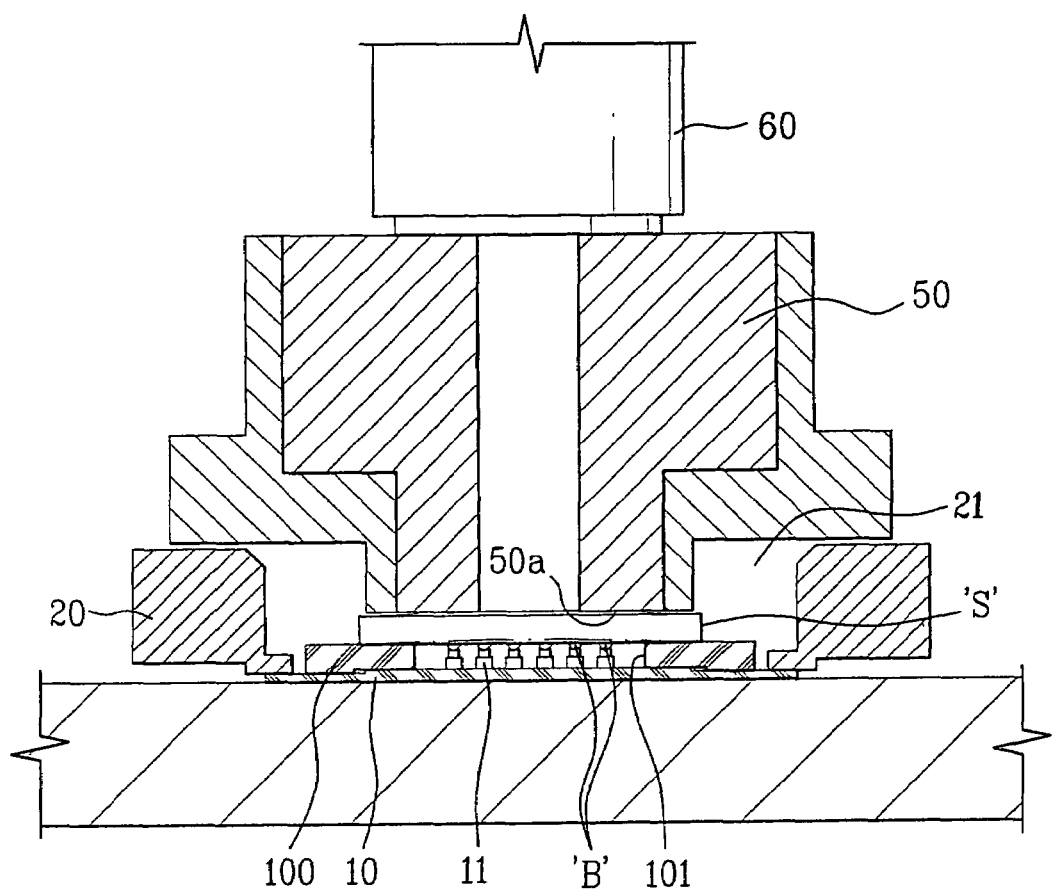
FIGS. 4 and 5 illustrate sectional views of key parts each describing that each semiconductor having a different thickness is connected to a socket assembly of FIG. 2.

FIG. 4 describes a connection state when testing a thinner semiconductor.

As shown in FIG. 4, when a separate transportation device moves a test tray (not shown) and lines up carriers 50 in an outer side of a socket assembly, a press unit 60 outside presses each carrier 50 at a predetermined power and then a semiconductor (S) mounted on each carrier 50 moves toward a socket board 10 through a open part 21 of a socket guide 20.

In succession, at the moment that balls (B) of the semiconductor (S) are connected to connection pins 11 of the socket board 10, edge portion of the ball forming surface are supported, touching the spacer 100, thereafter the semiconductor (S) maintaining a predetermined distance with the socket board 10. At this time a lower surface of the carrier 50 is closely adjacent to an upper surface of the socket guide 20.

Figure 5:
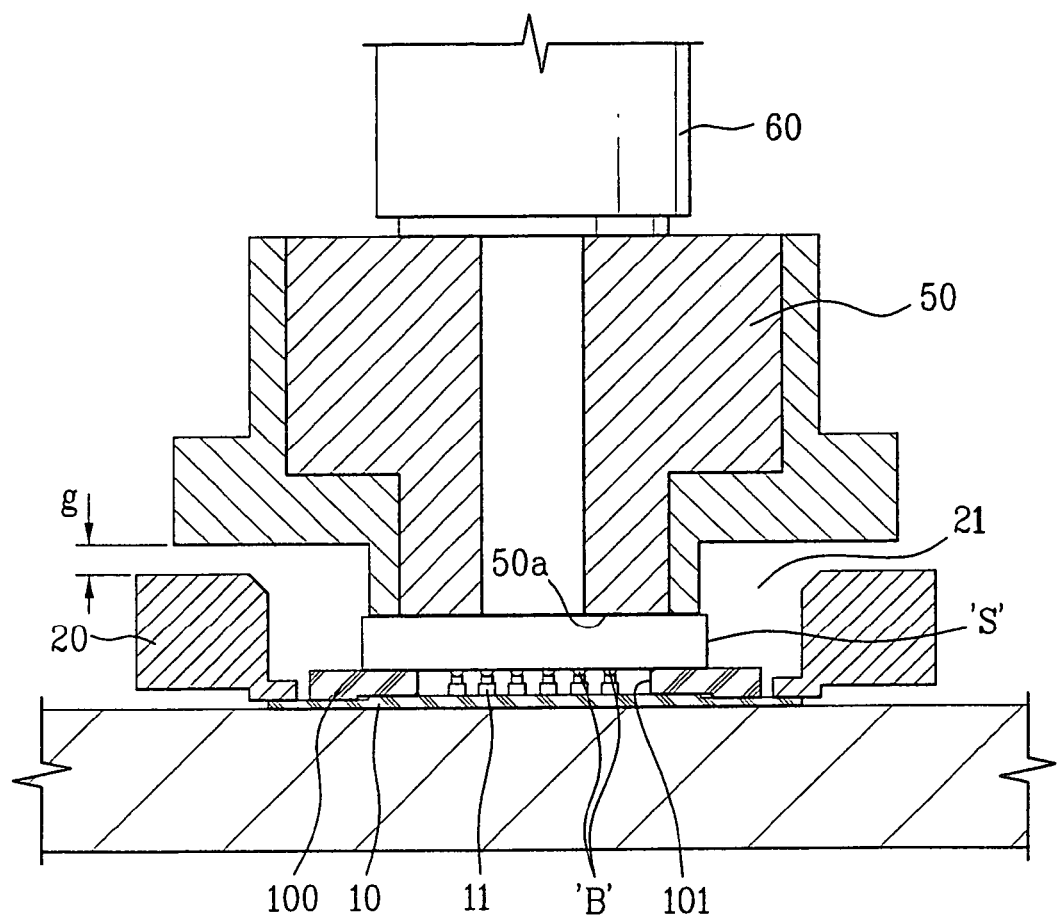

As shown in FIG. 5, in case of testing a thicker semiconductor than the semiconductor of FIG. 4, a surface of a semiconductor (S) is supported, touching a spacer 100 when a semiconductor being connected to the connection pins 11, thereby the distance between the semiconductor (S) and the socket board 10 being the same as the distance illustrated in FIG. 4. That is, the semiconductor (S) is pressed to the connection pins 11 in a predetermined depth.

However, since the semiconductor (S) is thicker, the gap (g) between the lower surface of the carrier 50 and the socket guide 20 is increased as much as the thickness of the semiconductor (S) increased.

According to the present invention, when the semiconductor (S) is connected to the connection pins 11, the semiconductor (S) is supported, touching the spacer 100 first and then the carrier 50 touches the socket guide 20, resulting in the semiconductor (S) maintaining a predetermined distance with the socket board 10. Accordingly, the semiconductors (S) may be connected to the connection pins 11 at a predetermined distance all the time even if the semiconductors have various thicknesses.

Figure 6:
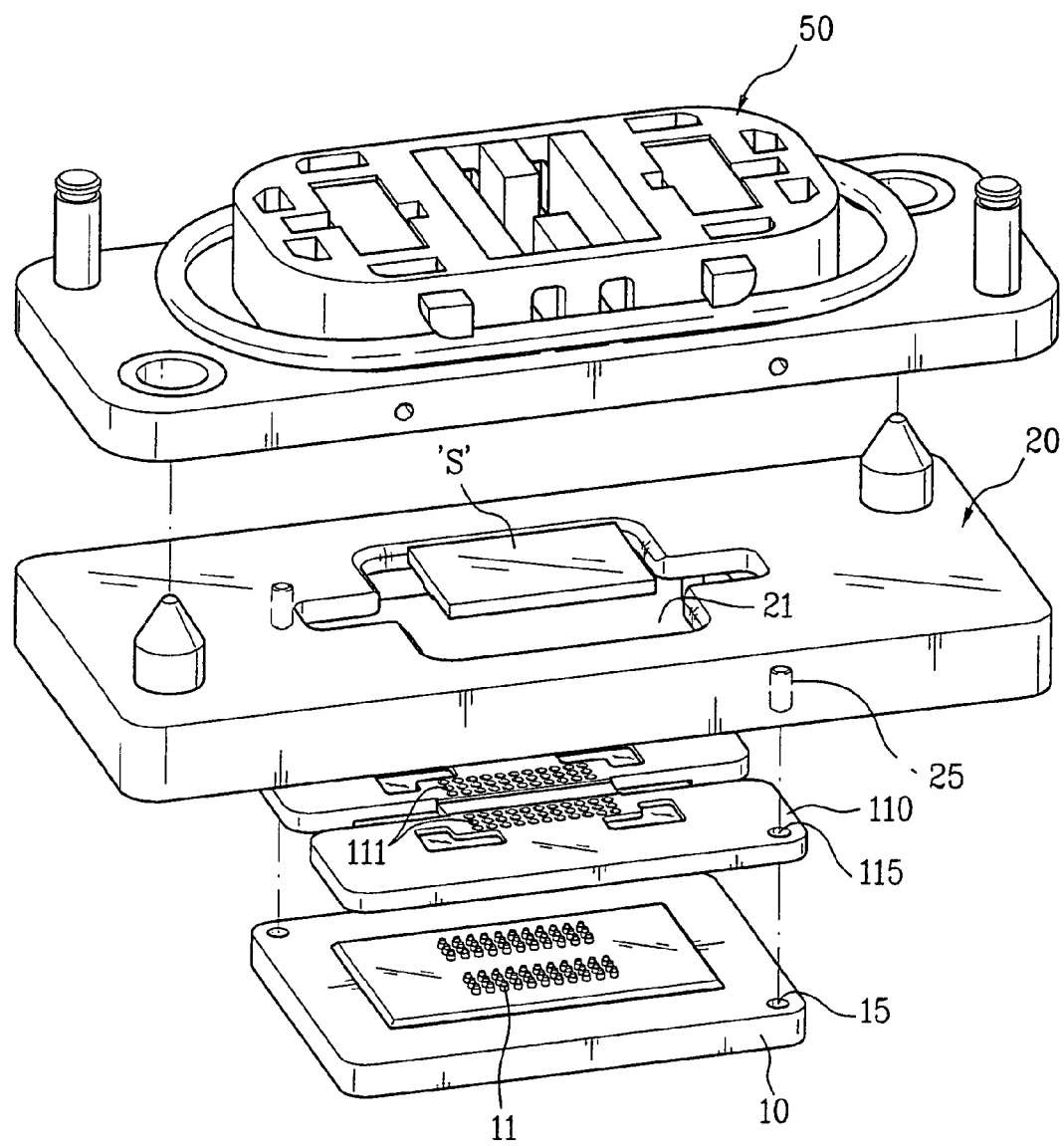
FIG. 6 illustrates an exploded perspective view of a second preferred embodiment of a socket assembly according to the present invention.

Also, as shown in FIG. 4, Edges of a semiconductor (S) are pressed and at the same time supported by a spacer 100. Thereby, the semiconductor (S) may be connected in a straight flat state though a bending of a semiconductor (S) occurs. Accordingly, it is possible to press the entire area of the semiconductor (S) uniformly without applying too much force to the semiconductor (S), FIGS. 6 through 8 describe a second embodiment of the present invention.

A socket assembly according to the second embodiment, similar to the socket assembly according to the first embodiment as mentioned above, comprises a socket board 10, a socket guide 20, and a spacer 110.

In the socket board 10, a plurality of connection pins is formed and the socket guide 20 is mounted to cover the socket board 10. The spacer 110 is interposed between the socket board 10 and the socket guide 20 for contactably supporting a surface of a semiconductor (S).

There is a difference between the socket assembly according to the second embodiment and the socket assembly according to the. first embodiment in a structure of the spacer 110. That is, in the center of the spacer 110 of the second embodiment according to the second embodiment, a plurality of pass through holes 111 is formed so that the connection pins 11 could be inserted respectively.

Figure 7:
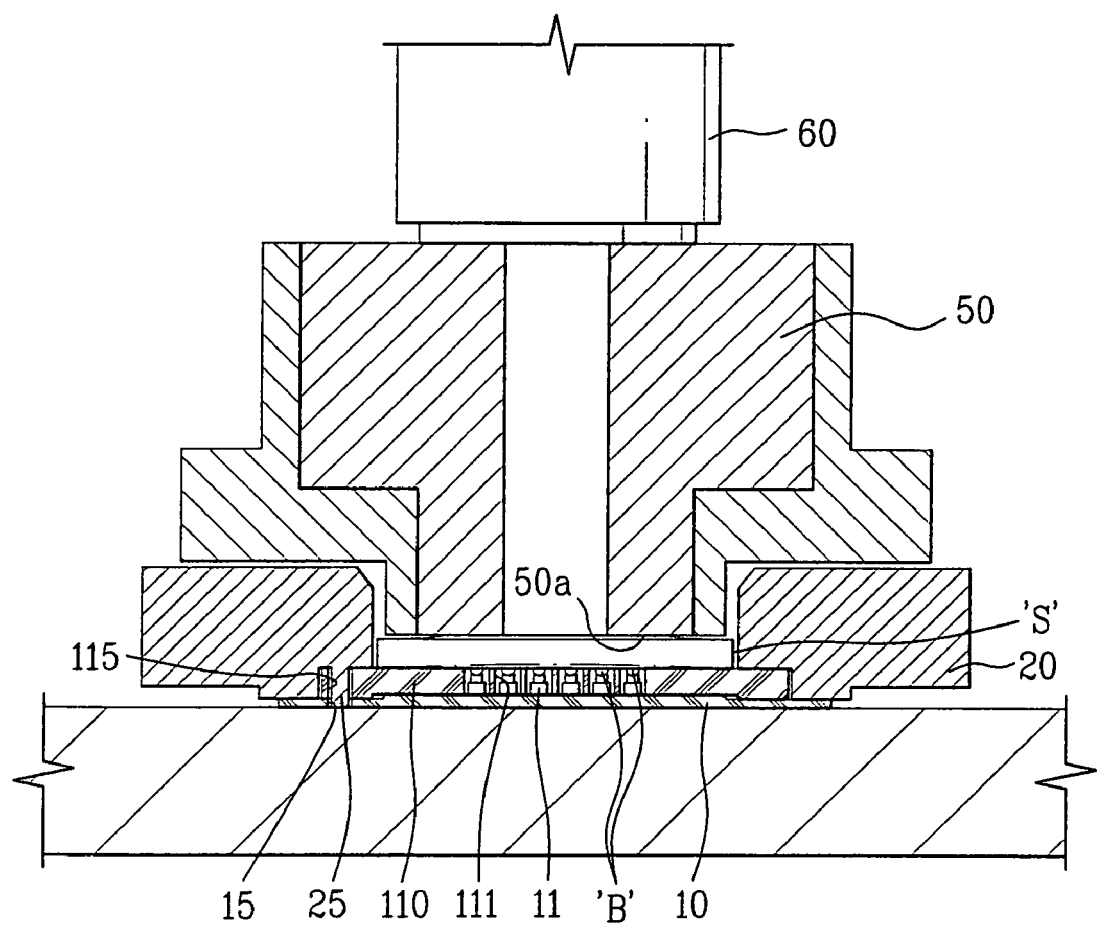
FIGS. 7 and 8 illustrate sectional views of key parts each describing that each semiconductor having a different thickness is connected to a socket assembly of FIG. 6.
Figure 8:
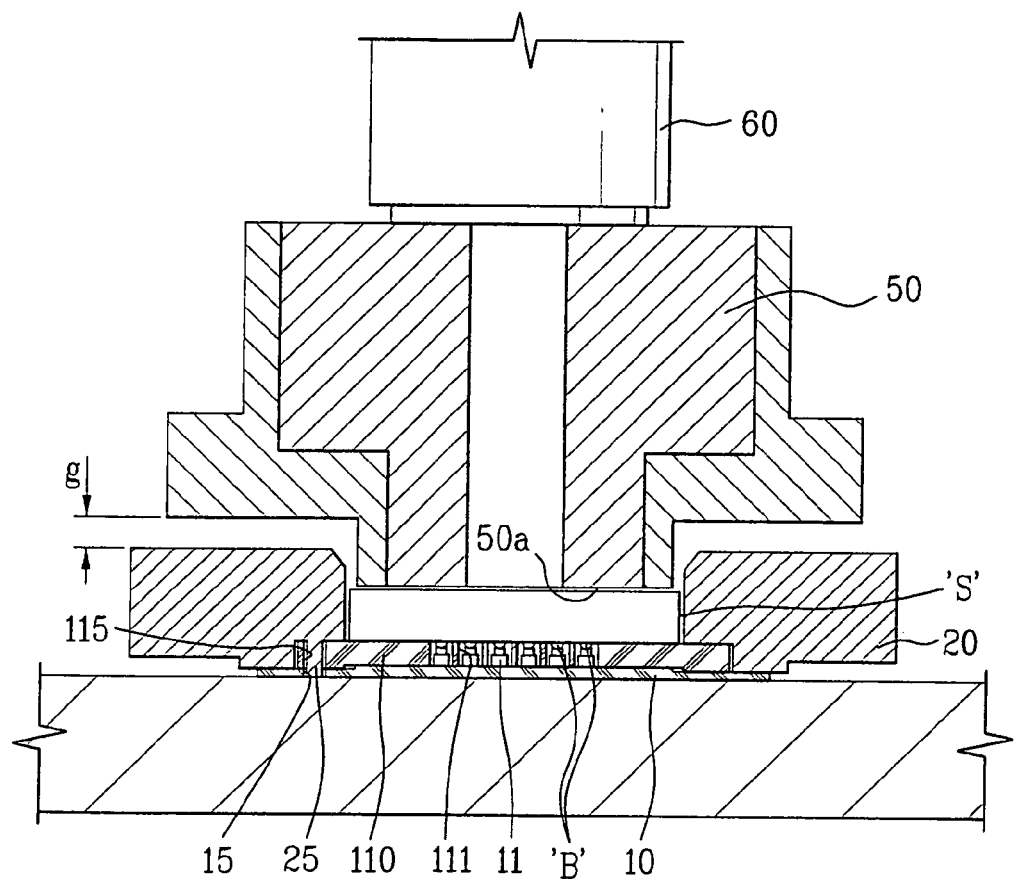

Thus, as shown in FIGS. 7 and 8, when a semiconductor (S) is connected to a socket board 10, each ball (B) of the semiconductor (S) is connected to connection pins 11 through each pass through hole 111 and the entire area of the semiconductor (S) except the area of the balls (S) is supported, touching an upper surface of the spacer 110. Thereby, the semiconductor (S) is capable of maintaining a predetermined distance with the socket board 10, so that the semiconductor (S) may be connected to the connection pins 11 in a predetermined depth.

Moreover, in the socket assembly according to the second embodiment, since the connection pins 111 are respectively inserted into each pass through hole 111 of the spacer 110, the arrangement among the spacer 110, the socket board 10 and the socket guide 20, when mounting the spacer 110 on an upper surface of the socket board 10, is precisely performed and it is needed to prevent the spacer 110 from moving after the arrangement.

Thus, a socket assembly according to the present invention further comprises a location decision unit including two location decision pins 25, two location decision holes 115, and two location decision recesses 15.

The two location decision pins 25 are perpendicularly formed at diagonal corners of an inner side of the socket guide 20 and the two location decision holes 115 are formed, passed through, at diagonal corners of the spacer 110 corresponding to the two location decision pins 25. The two location decision recesses 15 are formed at diagonal corners of the socket board 10 corresponding to the two location decision holes 115.

The location decision pins 25 of the socket guide 20 passes through the location decision holes 115 of the spacer 110 and the location decision recesses 15 of the socket board 10 in order, so that it is possible to perform the precise arrangement when assembling the socket assembly and to prevent the location from being moved during the test.

Figure 9:
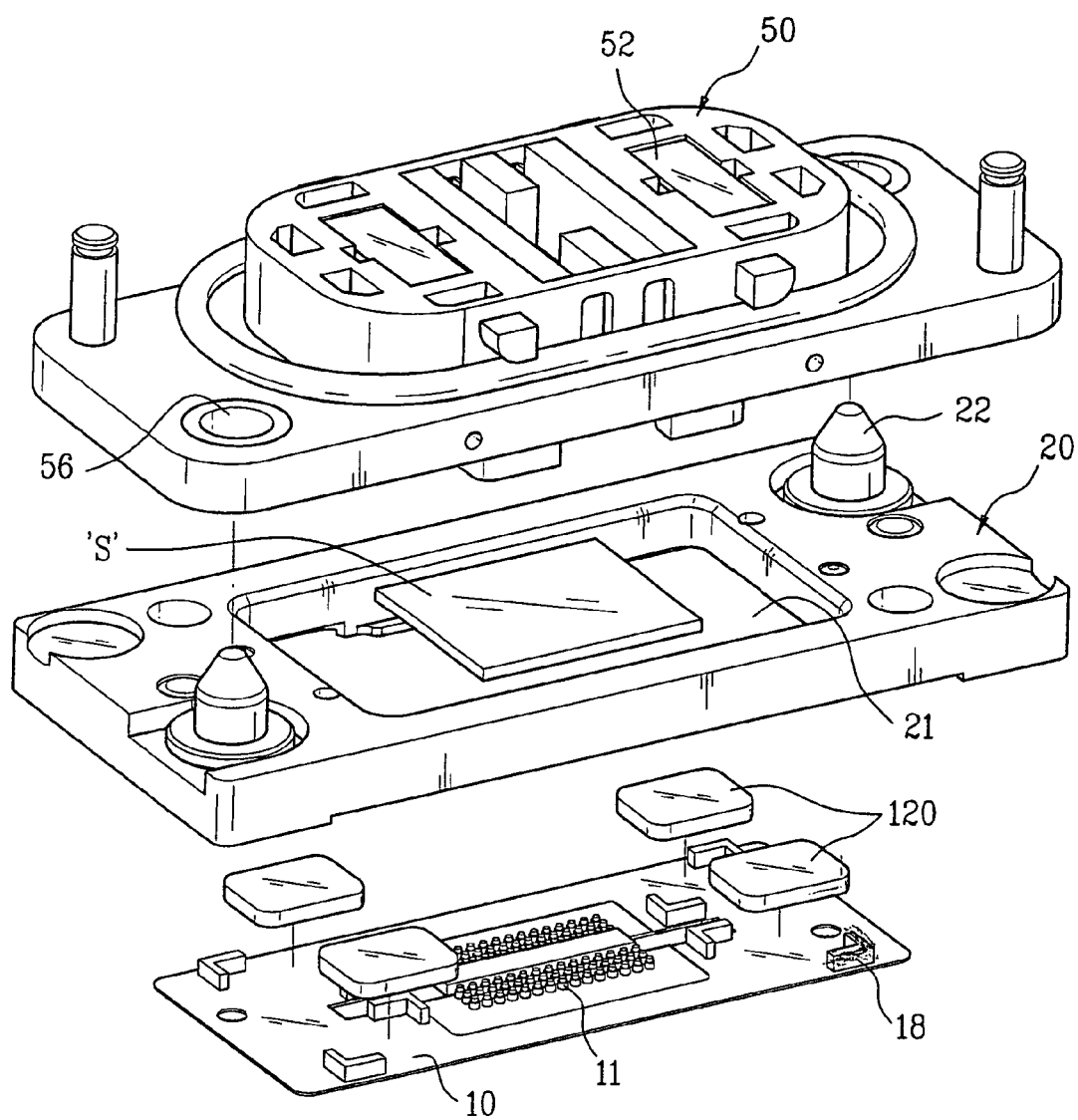
FIG. 9 illustrates an exploded perspective view of a third preferred embodiment of a socket assembly for testing semiconductor device according to the present invention.

On the other hand, in the socket assembly of each above embodiment, the spacer is formed in a single unit in a plate shape. However, as shown in FIG. 9, the spacers 120 may be formed divided in plural so as to touch the area except the area of the balls (B) of a semiconductor (S).

A plurality of guide projections 18 may be formed on an upper surface of the socket board 10 for guiding the installation location of each spacer 120.

In the embodiments of the present invention, each spacer is formed, separated from the socket board, however it may be formed, united in a single unit to the socket board.

Accordingly, the present invention has the following advantageous effects.

First, when a semiconductor is connected to connection pins, a semiconductor is supported, touching a spacer first before a carrier touches a socket guide, so that the semiconductor may maintain a predetermined distance with the socket board, thereby the semiconductor connected to the connection pins in a predetermined depth in spite of various thicknesses of the semiconductors. Thus, it is not needed to replace carriers according to the thicknesses of the semiconductors. thereby reducing an expense and time caused by replacing carriers.

Second, since edges of a semiconductor are pressed, supported by a spacer, the semiconductor is connected in a straight flat state although a bending of a semiconductor occurs. Therefore, the entire area of the semiconductor may be uniformly pressed without applying too much force to the semiconductor.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A socket assembly for testing a semiconductor device, wherein a semiconductor detachably secured on a carrier provided in a handler is electrically connected to a socket for testing, the socket assembly comprising:
   a socket board electrically connected to an outside testing device, wherein the socket board comprises a plurality of connection pins configured to be connected to leads of said semiconductor;
   a socket guide configured to cover the socket board, wherein the socket guide comprises an open part that extends therethrough so as to receive said semiconductor therein for connection to the plurality of connection pins of the socket board;
   a spacer positioned within the open part of the socket guide and on an upper surface of the socket board corresponding to the open part of the socket guide, wherein the spacer is configured to maintain a predetermined distance between the semiconductor and the socket board such that a surface of the semiconductor contacts a surface of the spacer before a surface of the carrier contacts the socket guide;
   and a location unit provided on an inner side of the socket guide and configured to establish a location of the spacer.

2. The socket assembly of claim 1, wherein the spacer is formed in a plate shape having a predetermined thickness, with an open part formed therein through which the plurality of connection pins of the socket board pass.

3. The socket assembly of claim 1, wherein the spacer is formed in a plate shape having a predetermined thickness, with a plurality of pass through holes formed therein corresponding to the plurality of connection pins of the socket board, wherein the plurality of pass through holes are configured to receive the plurality of connection pins therethrough.

4. The socket assembly of claim 1, wherein the spacer is formed as a single unit with the socket board.

5. The socket assembly of claim 1, wherein the spacer comprises a plurality of individual spacers that overlie the socket board.

6. The socket assembly of claim 1, wherein the spacer is made of a resin.

7. The socket assembly of claim 1, wherein the location unit comprises:
   at least one location pin extending perpendicular to a side surface of the socket guide;
   at least one location hole formed in the spacer, wherein each location hole corresponds to a location pin, wherein the at least one location pin is configured to pass through the at least one location hole; and
   at least one location recess formed in the socket board, wherein each location recess corresponds to a location pin, wherein the at least one location pin is configured to be inserted into the at least one location recess.

8. The socket assembly of claim 1, wherein the location unit comprises a plurality of projections which extend from the socket board towards corners of the spacer so as to maintain the spacer in a predetermined position.

9. The socket assembly of claim 5, further comprising a location unit provided on an inner side of the socket guide and configured to establish a location of each of the plurality of individual spacers.

10. The socket assembly of claim 9, wherein the location unit comprises a plurality of projections extending from the socket board towards corners of each of the plurality of individual spacers so as to maintain the plurality of individual spacers in predetermined positions.

11. The socket assembly of claim 1, wherein the spacer is configured to support an outer peripheral edge of the semiconductor.

12. The socket assembly of claim 1, wherein the location unit comprise:
   a location pin formed on one of the socket guide or the spacer;
   a location hole formed on the other of the socket guide or the spacer, wherein the location pin is received in the location hole such that the spacer is precisely located with respect to the socket guide.

13. A method of testing a semiconductor device using a socket assembly comprising a socket board, a socket guide and a spacer that positioned within an open part that extends through the socket guide on an upper surface of the socket board corresponding to the open part of the socket guide, and a location unit provided on an inner side of the socket guide and configured to establish a location of the spacer, the method comprising:
   positioning a semiconductor device in a carrier;
   moving the carrier towards a socket board covered by a socket guide until a surface of the semiconductor device contacts a surface of the spacer and such that connecting leads on the semiconductor device are coupled to corresponding terminals on the socket board through an opening formed in the socket guide; and
   conducting a test on the semiconductor device.

14. The method of claim 13, wherein the moving step comprises supporting an outer peripheral edge of the semiconductor device on the spacer when the semiconductor device contacts the spacer.

15. The method of claim 13, wherein the moving step comprises maintaining a predetermined distance between the semiconductor device and the socket board based on a thickness of the spacer.

16. The method of claim 15, wherein during the moving step, a surface of the semiconductor device contacts a surface of the spacer before a surface of the carrier contacts the socket guide.

17. The method of claim 13, wherein connecting leads on the semiconductor device to corresponding terminals on the socket board through an opening formed in the socket guide further comprises extending leads of the semiconductor device through an opening in the spacer corresponding to an opening in the socket guide.

18. The method of claim 17, wherein the opening in the spacer comprises a plurality of openings corresponding to the leads on the semiconductor device.

19. The method of claim 17, wherein the opening in the spacer comprises a space formed between a plurality of individual spacers positioned over the socket board.

* * * * *